(12) United States Patent
Choi et al.

(10) Patent No.: US 8,569,944 B2
(45) Date of Patent: Oct. 29, 2013

(54) LIGHT EMITTING DEVICE

(75) Inventors: Hyuck Jung Choi, Ansan-si (KR); Kwang Il Park, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 13/164,379

(22) Filed: Jun. 20, 2011

(65) Prior Publication Data

US 2011/0248296 A1 Oct. 13, 2011

Related U.S. Application Data

(60) Continuation of application No. 12/827,737, filed on Jun. 30, 2010, now Pat. No. 8,405,304, which is a division of application No. 11/964,443, filed on Dec. 26, 2007, now Pat. No. 7,906,892.

(30) Foreign Application Priority Data

Dec. 26, 2006 (KR) .................. 10-2006-0133993
Dec. 28, 2006 (KR) .................. 10-2006-0136442

(51) Int. Cl.
*H01J 1/62* (2006.01)
*H01J 63/04* (2006.01)

(52) U.S. Cl.
USPC .......... 313/501; 313/498; 313/499; 313/502; 313/506; 313/512; 362/311.02; 362/346

(58) Field of Classification Search
USPC ................ 313/498, 506, 499, 501, 503, 512; 257/89; 362/311.02, 346
See application file for complete search history.

(56) References Cited

U.S. PATENT DOCUMENTS 5,813,753 A 9/1998 Vriens et al.
6,155,699 A 12/2000 Miller et al.
(Continued)

FOREIGN PATENT DOCUMENTS

JP 54-019660 2/1979
JP 04-204903 7/1992
(Continued)

OTHER PUBLICATIONS

Final Office Action of U.S. Appl. No. 12/827,737 dated Mar. 22, 2012.
(Continued)

*Primary Examiner* — Nimeshkumar Patel
*Assistant Examiner* — Thomas A Hollweg
(74) *Attorney, Agent, or Firm* — H.C. Park & Associates, PLC

(57) ABSTRACT

Disclosed herein is a light emitting device. The light emitting device includes a light emitting diode disposed on a substrate to emit light of a first wavelength. A transparent molding part encloses the LED, a lower wavelength conversion material layer is disposed on the transparent molding part, and an upper wavelength conversion material layer is disposed on the lower wavelength conversion material layer. The lower wavelength conversion material layer contains a phosphor converting the light of the first wavelength into light of a second wavelength longer than the first wavelength, and the upper wavelength conversion material layer contains a phosphor converting the light of the first wavelength into light of a third wavelength, which is longer than the first wavelength but shorter than the second wavelength. Light produced via wavelength conversion is prevented from being lost by the phosphor. Light emitting devices including a multilayer reflection minor are also disclosed.

17 Claims, 4 Drawing Sheets

(56) References Cited

U.S. PATENT DOCUMENTS

| | | | |
|---|---|---|---|
| 6,222,868 B1 | 4/2001 | Ouchi et al. | |
| 6,642,652 B2 | 11/2003 | Collins, III et al. | |
| 6,650,044 B1 | 11/2003 | Lowery | |
| 6,686,676 B2 * | 2/2004 | McNulty et al. | 313/112 |
| 6,717,362 B1 * | 4/2004 | Lee et al. | 313/512 |
| 6,741,029 B2 * | 5/2004 | Matsubara et al. | 313/512 |
| 6,888,173 B2 * | 5/2005 | Ishii et al. | 257/100 |
| 7,029,935 B2 * | 4/2006 | Negley et al. | 438/29 |
| 7,091,661 B2 | 8/2006 | Ouderkirk et al. | |
| 7,176,612 B2 | 2/2007 | Omoto et al. | |
| 7,250,715 B2 | 7/2007 | Mueller et al. | |
| 7,446,343 B2 | 11/2008 | Mueller et al. | |
| 2001/0050371 A1 * | 12/2001 | Odaki et al. | 257/98 |
| 2002/0180351 A1 | 12/2002 | McNulty et al. | |
| 2004/0061440 A1 * | 4/2004 | Imai et al. | 313/512 |
| 2004/0145895 A1 * | 7/2004 | Ouderkirk et al. | 362/260 |
| 2004/0207313 A1 | 10/2004 | Omoto et al. | |
| 2005/0184638 A1 * | 8/2005 | Mueller et al. | 313/485 |
| 2006/0097245 A1 | 5/2006 | Aanegola et al. | |
| 2006/0102914 A1 * | 5/2006 | Smits et al. | 257/98 |
| 2006/0105485 A1 * | 5/2006 | Basin et al. | 438/27 |
| 2006/0138435 A1 | 6/2006 | Tarsa et al. | |
| 2006/0171152 A1 * | 8/2006 | Suehiro et al. | 362/363 |
| 2007/0085105 A1 | 4/2007 | Beeson et al. | |
| 2007/0152231 A1 * | 7/2007 | Destain | 257/99 |
| 2009/0167151 A1 | 7/2009 | Kolodin et al. | |
| 2009/0283787 A1 | 11/2009 | Donofrio et al. | |
| 2009/0315053 A1 | 12/2009 | Lee et al. | |
| 2010/0084668 A1 | 4/2010 | Choi et al. | |
| 2011/0248296 A1 | 10/2011 | Choi et al. | |

FOREIGN PATENT DOCUMENTS

| | | |
|---|---|---|
| JP | 07-111343 | 4/1995 |
| JP | 08-335720 | 12/1996 |
| JP | 11-214744 | 8/1999 |
| JP | 11-214747 | 8/1999 |
| JP | 2000-515689 | 11/2000 |
| JP | 2002064220 | 2/2002 |
| JP | 2002-115053 | 4/2002 |
| JP | 2005-093601 | 4/2005 |
| JP | 2005-142311 | 6/2005 |
| JP | 2005-183727 | 7/2005 |
| JP | 2005-228996 | 8/2005 |
| JP | 2005-244226 | 9/2005 |
| JP | 2005-311136 | 11/2005 |
| JP | 2006-126377 | 5/2006 |
| JP | 2006-148147 | 6/2006 |
| JP | 2006-295215 | 10/2006 |
| JP | 2008-541361 | 11/2008 |
| KR | 10-2005-0117164 | 12/2005 |
| WO | 98/54930 | 12/1998 |
| WO | 2006/006544 | 1/2006 |
| WO | 2006/067885 | 6/2006 |
| WO | 2006/119750 | 11/2006 |

OTHER PUBLICATIONS

Non-Final Office Action issued on Jun. 27, 2012 in U.S. Appl. No. 12/827,737.

Notice of Allowance and Fee(s) Due for corresponding U.S. Appl. No. 12/827,737 dated Feb. 1, 2013.

Notice of Allowance dated Sep. 9, 2010, (from co-pending U.S. Appl. No. 11/964,443).

Notice of Allowance dated Nov. 30, 2010 (from co-pending U.S. Appl. No. 11/964,443).

Non-Final Office Action issued on Nov. 30, 2011 in co-pending U.S. Appl. No. 12/827,737.

* cited by examiner

LIGHT EMITTING DEVICE

CROSS REFERENCE TO RELATED APPLICATIONS

This application is a continuation of U.S. patent application Ser. No. 12/827,737, filed on Jun. 30, 2010, which is a divisional of U.S. patent application Ser. No. 11/964,443, filed Dec. 26, 2007, and claims priority from Korean Patent Application No. 10-2006-0133993, filed Dec. 26, 2006, and Korean Patent Application No. 10-2006-0136442 filed Dec. 28, 2006, which are all hereby incorporated by reference for all purposes as if fully set forth herein.

BACKGROUND OF THE INVENTION

1. Field of the Invention

The present invention relates to a light emitting device, and more particularly to a light emitting device capable of preventing light, emitted from a light emitting diode or produced is via wavelength conversion, from being lost within the light emitting device.

2. Description of the Related Art

Light emitting devices manufactured with compound semiconductor light emitting diodes can realize various colors and are used for various applications including lamps, electronic display boards, and displays. In particular, since the light emitting device can realize white light, it is used for general lighting and light sources of liquid crystal display panels.

Generally, white light can be obtained by combination of a blue light emitting diode (LED) and phosphors, and one example of light emitting devices that realize white light based on the blue LED and YAG phosphor is disclosed in JP Patent Laid-open No. 2002-064220. However, the technique of this disclosure realizes white light by mixing blue light and yellow light, and exhibits poor properties in view of color reproducibility and color rendering characteristics due to lack of light in the range of red color wavelengths. On the other hand, white light can be realized by three LEDs including a blue LED, a green LED and a red LED, but in this case, the light emitting device exhibits poor color rendering characteristics irrespective of good color reproducibility due to narrow wavelength ranges of light emitted from the LEDs.

In order to solve the aforementioned problems, US Patent Publication No. 2004/0207313 A1 discloses a light emitting device, which comprises a blue LED, a green phosphor and a red phosphor to realize white light, or which comprises a red LED along with the blue LED and the phosphors to realize white light. According to this disclosure, the blue LED is sealed by a light-transmitting resin that contains both green and red phosphors to realize white light having good color reproducibility and color rendering characteristics. Further, the color reproducibility can be improved by adopting the blue LED, green phosphor and red LED. At this point, a light-transmitting resin containing the green phosphor encloses the blue LED and converts a fraction of light emitted from the blue LED into green light. Additionally, there is one example of the light emitting devices that includes a blue LED, a red LED and an ultraviolet LED such that the ultraviolet LED is enclosed by the light-transmitting resin containing the green phosphor to realize white light.

For the light emitting device including the blue LED, the green phosphor and the red phosphor, as disclosed in US Patent Publication No. 2004/0207313 A1, since the green and red phosphors are dispersed in the same light-transmitting resin, green light emitted from the green phosphor tends to be absorbed by the red phosphor. Generally, phosphors exhibit different efficiencies in wavelength conversion according to excited wavelengths. For example, the red phosphor serves to perform wavelength conversion of light emitted from the blue LED into red light, and thus exhibits good efficiency in wavelength conversion from blue light into red light. Accordingly, most of the green light absorbed into the red phosphor is lost through conversion into heat. As a result, in the case where both the green phosphor and the red phosphor are contained in the light-transmitting resin, the light emitting device experiences a lack of green light and a reduction in light emitting efficiency due to a great amount of light lost therein.

Further, light produced via the wavelength conversion in the phosphor can enter the blue LED again. After entering the blue LED, the light passes through the blue LED, and can be absorbed, and thereby lost, into the bottom surface of a substrate where the blue LED is mounted, so that the light emitting efficiency can be further reduced.

For the light emitting device further including the red LED, at least a fraction of light emitted from the red LED can enter the light-transmitting resin containing the phosphor, and other fractions can enter the blue LED or the ultraviolet LED. When red light enters the light-transmitting resin, the light does not excite the phosphor but is instead lost due to diffuse reflection from the phosphor. Further, when red light enters the blue LED or an LED for short wavelength visible light, it can be lost due to reflection within these LEDs. As a result, the intensity of red light is decreased, which necessitates an increase in the number of red LEDs or in drive current of the red LEDs to compensate for the decreased intensity of red light.

SUMMARY OF THE INVENTION

The present invention is conceived to solve the problems of the conventional techniques as described above, and an aspect of the present invention is to provide a light emitting device capable of preventing light produced via wavelength conversion from being lost through absorption into a phosphor.

Another aspect of the present invention is to provide a light emitting device capable of preventing light produced via wavelength conversion from being lost through reentrance into an LED.

A further aspect of the present invention is to provide a light emitting device capable of preventing light, emitted from an LED for emitting long wavelength light, from being lost by an LED for emitting short wavelength light or by a phosphor.

In accordance with one aspect of the present invention, a light emitting device includes a plurality of wavelength conversion material layers. The light emitting device includes a light emitting diode disposed on a substrate to emit light of a first wavelength. A transparent molding part encloses the light emitting diode, a lower wavelength conversion material layer is disposed on the transparent molding part, and an upper wavelength conversion material layer is disposed on the lower wavelength conversion material layer. The lower wavelength conversion material layer contains a phosphor for converting the light of the first wavelength emitted from the light emitting diode into light of a second wavelength longer than the first wavelength, and the upper wavelength conversion material layer contains a phosphor for converting the light of the first wavelength emitted from the light emitting diode into light of a third wavelength longer than the first wavelength. Here, the third wavelength is shorter than the second wavelength. Accordingly, it is possible to prevent light produced via wavelength conversion through the wavelength conversion material layers from being lost by the phosphor. Further, the transparent molding part is interposed between the lower wavelength conversion material layer and the light emitting diode, so that the light produced via the wavelength conversion is prevented from reentering the light emitting diode, thereby reducing light loss.

The transparent molding part, the lower wavelength conversion material layer, and the upper wavelength conversion material layer may have the same refractive index, or may have refractive indexes increasing in this order. Hence, light emitted from the light emitting diode can be prevented from being lost due to total internal reflection.

The lower wavelength conversion material layer may include at least one opening through which the transparent molding part is exposed. The opening is filled with the upper wavelength conversion material layer. Accordingly, a fraction of light emitted from the light emitting diode can enter the upper wavelength conversion material layer without passing through the lower wavelength conversion material layer to excite the phosphor contained in the upper wavelength conversion material layer.

The light of the first wavelength may be blue light, the light of the second wavelength may be red light, and the light of the third wavelength may be green light to realize white light.

The transparent molding part and the upper and lower wavelength conversion material layers may be molded via a mold such that they can be produced in a variety of shapes.

The transparent molding part may have a lower hardness than the upper and lower wavelength conversion material layers. Further, the upper wavelength conversion material layer may have a higher hardness than the lower wavelength conversion material layer. For example, the transparent molding part may be formed of silicone, and the upper and lower wavelength conversion material layers may be formed of epoxy.

A lower dielectric multilayer reflection mirror may be interposed between the transparent molding part and the lower wavelength conversion material layer, and an upper dielectric multilayer reflection mirror may be interposed between the lower wavelength conversion material layer and the upper wavelength conversion material layer. The lower dielectric multilayer reflection mirror may be formed by repetitious deposition of a dielectric layer having a higher refractive index and a dielectric layer having a lower refractive index to exhibit high reflectance. Therefore, the light of the third wavelength produced via wavelength conversion in the upper wavelength conversion material layer is prevented from entering the lower wavelength conversion material layer, and the light of the second wavelength produced via the wavelength conversion in the lower wavelength conversion material layer is prevented from entering the transparent molding part.

Each of dielectric layers in the lower dielectric multilayer reflection mirror may have a thickness satisfying the relationship of $(2m-1)\lambda_2/4n_2$ (where $n_2$ indicates a refractive index of each of the dielectric layers, $\lambda_2$ indicates the second wavelength, and m indicates an integer greater than or equal to 1), and each of dielectric layers in the upper dielectric multilayer reflection mirror may have a thickness satisfying the relationship of $(2k-1)\lambda_3/4n_3$ (where $n_3$ indicates a refractive index of each of the dielectric layers, $\lambda_3$ indicates the third wavelength, and k indicates an integer greater than or equal to 1). Preferably, m and k in the respective is relationships are 1.

Additionally, the lower wavelength conversion material layer may have at least one opening through which the transparent molding part is exposed, and the opening may be filled with the upper wavelength conversion material layer. At this point, the upper dielectric multilayer reflection minor may extend into the opening to be interposed between the transparent molding part and the upper wavelength conversion material layer in the opening.

In accordance with another aspect of the present invention, a light emitting device includes a dielectric multilayer reflection minor. The light emitting device includes a first light emitting diode disposed on a substrate to emit light of a first wavelength. A wavelength conversion material encloses the first light emitting diode. The wavelength conversion material contains a phosphor for performing wavelength conversion of a fraction of light emitted from the first light emitting diode. A second light emitting diode is separated from the wavelength conversion material and disposed on the substrate. The second light emitting diode emits light of a second wavelength longer than the first wavelength. A dielectric multilayer reflection minor is formed on the wavelength conversion material. The dielectric multilayer reflection minor includes at least one pair of dielectric layers, one having a higher refractive index and the other having a lower refractive index, and reflects the light of the second wavelength incident on the wavelength conversion material. Hence, light emitted from the second light emitting diode can be prevented from entering and being lost in the wavelength conversion material, thereby improving light emitting efficiency for the light of the second wavelength.

Each of the dielectric layers may have a thickness "d" satisfying the relationship: $d(2m-1)\lambda/4n$ (where n indicates a refractive index of each of the dielectric layers, $\lambda$ indicates the second wavelength, and m indicates an integer greater than or equal to 1). Preferably, m is 1.

The light emitting device may further include a sealing resin enclosing the wavelength conversion material and the second light emitting diode. At this point, the sealing resin may have a lower refractive index than the dielectric layer of the higher refractive index.

In some embodiments, the light emitting device may further include another second light emitting diode symmetrical to the second light emitting diode centered on the first light emitting diode. As such, since the second light emitting diodes are symmetrically disposed around the first light emitting diode, the light emitting device can realize mixed light of uniform brightness.

In some embodiments, the dielectric multilayer reflection mirror may be partially formed on the wavelength conversion material. As a result, light emitted from the second light emitting diode can be reflected by the reflection minor when it enters the wavelength conversion material, and it is also possible to reduce loss of light emitted from the first light emitting diode and light produced via wavelength conversion by the phosphor, as could be caused by the reflection minor.

The wavelength conversion material may be a material layer formed on the light emitting diode and having a uniform thickness.

The first light emitting diode may emit blue light or ultraviolet rays having a peak wavelength of 490 mm or less, and the second light emitting diode may emit red light having a peak wavelength of 580 nm or more.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Figure 1:
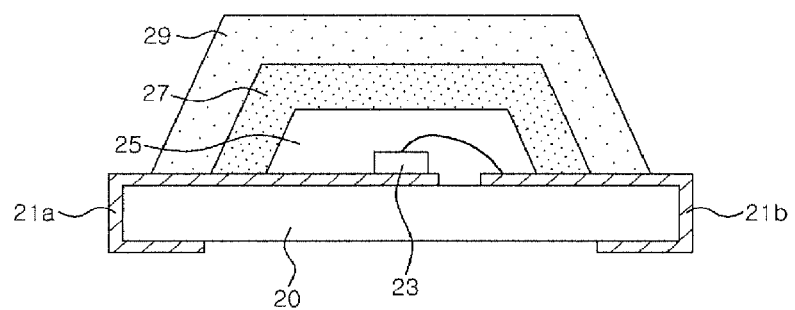
FIG. 1 is a cross-sectional view of a light emitting device including a plurality of wavelength conversion material layers according to a first embodiment of the present invention.

Exemplary embodiments of the present invention will be described in detail with reference to the accompanying drawings hereinafter. The following embodiments are given by way of illustration only to help those skilled in the art fully understand the spirit of the present invention. Hence, it should be noted that the present invention is not limited to the embodiments is described herein and can be realized in various forms. Further, the drawings are not to precise scale and components therein may be exaggerated in view of thickness, width, length, etc. Herein, the similar or identical reference numerals will denote the similar or identical components throughout the drawings.

FIG. 1 is a cross-sectional view of a light emitting device including a plurality of wavelength conversion material layers according to a first embodiment of the present invention.

Referring to FIG. 1, a light emitting diode (LED) 23 is mounted on a substrate 20. The substrate 20 may be a printed circuit board 20 that includes lead electrodes 21a and 21b in this embodiment. However, it can be selected from any substrate including a lead frame, a heat sink, a plastic package body, etc. without being limited to a particular substrate, as long as it permits a light emitting diode to be mounted thereon. The light emitting diode can be formed by growing GaAlInN-based compound semiconductor layers on a substrate formed of, for example, sapphire, SiC, spinel, or the like, and can emit ultraviolet rays or blue light as light of a first wavelength.

The LED 23 may be attached to the lead electrode 21a via conductive adhesives (not shown) and electrically connected to the lead electrode 21b through a bonding wire. Alternatively, the LED 23 may be electrically connected to the lead electrodes 21a and 21b through two bonding wires, or may be attached to a sub-mount (not shown) and electrically connected to the lead electrodes 21a and 21b via the sub-mount.

A transparent molding part 25 is formed on the substrate 20 to enclose the LED 23. The transparent molding part 25 may be formed to enclose the bonding wire. The transparent molding part 25 may be formed of a resin, for example, silicone, that has a relatively low hardness. The transparent molding part 25 does not contain a phosphor, so that light having is entered the transparent molding part 25 from the LED 23 can be prevented from reentering the LED 23 after being subjected to wavelength conversion near the LED 23.

A lower wavelength conversion material layer 27 is disposed on the transparent molding part 25. The lower wavelength conversion material layer 27 contains a phosphor capable of converting the light of the first wavelength, emitted from the LED 23, into light of a second wavelength. The light of the second wavelength is longer than the first wavelength. For example, if the light of the first wavelength is ultraviolet rays or blue light, the light of the second wavelength can be red light. As a result, a portion of the light of the first wavelength emitted from the LED 23 is converted into the light of the second wavelength by the phosphor, which is contained in the lower wavelength conversion material layer 27.

Furthermore, an upper wavelength conversion material layer 29 is disposed on the lower wavelength conversion material layer 27. The upper wavelength conversion material layer 27 contains a phosphor capable of converting the light of the first wavelength emitted from the LED 23 into light of a third wavelength. The light of third wavelength is longer than the first wavelength, but is shorter than the light of the second wavelength. For example, if the light of the second wavelength is red light, the light of the third wavelength can be green light.

Since phosphors are generally excited by excited light and emit light having longer wavelengths than the excited light, light having longer wavelengths than emitted wavelengths cannot excite the phosphors when it enters the phosphors. Hence, the light of the second wavelength, produced via wavelength conversion in the phosphor contained in the lower wavelength conversion material layer 27, has a longer wavelength than that of light, which is emitted from the phosphor contained in the upper wavelength conversion material layer 29, and thus, cannot excite the phosphor contained in the upper wavelength conversion material layer 29. As a result, the light of the second wavelength, produced via the wavelength conversion in the lower wavelength conversion material layer 27, can be emitted to the outside after transmission through the upper wavelength conversion material layer 29.

The upper and lower wavelength conversion material layers 29 and 27 may be formed of the same material as that of the transparent molding part 25, but are not limited thereto, and they may be formed of different materials from that of the transparent molding part 25. At this point, the lower wavelength conversion material layer 27 is preferably formed of a material having a higher refractive index than the transparent molding part 25. Further, the upper wavelength conversion material layer 29 may be formed of a material having the same or a higher refractive index than the lower wavelength conversion material layer 27. Accordingly, it is possible to prevent light emitted from the LED 23 from being lost due to total internal reflection by an interface between the transparent molding part 25 and the lower wavelength conversion material layer 27 or by an interface between the lower wavelength conversion material layer 27 and the upper wavelength conversion material layer 29. Further, it is possible to reduce reentrance of light, produced via wavelength conversion through the upper and lower wavelength conversion material layers 29 and 27, inward.

In addition, the upper and lower wavelength conversion material layers 29 and 27 may be formed of a material having a higher hardness than the transparent molding part 25. For example, when the transparent molding part 25 is formed of silicone, the upper and lower wavelength conversion material layers 29 and 27 may be formed of an epoxy containing respective phosphors. With this configuration, it is possible to prevent the transparent molding part 25 from being separated from the substrate 20 while protecting the LED from external force.

According to this embodiment, the lower wavelength conversion material layer 27, which contains a phosphor for converting, for example, blue light into red light, is disposed on the LED 23 that emits blue light, and the upper wavelength conversion material layer 29, which contains a phosphor for converting the blue light into green light, is disposed on the lower wavelength conversion material layer 27, thereby realizing white light. Alternatively, when the LED 23 emits ultraviolet rays, the light emitting device includes the lower wavelength conversion material layer 27, which contains a phosphor for converting the ultraviolet rays into red light, the upper wavelength conversion material layer 29, which contains a phosphor for converting the ultraviolet rays into green light, and an additional wavelength conversion material layer (not shown), which contains a phosphor for converting the ultraviolet rays into blue light, thereby realizing white light.

The transparent molding part 23 and the upper and lower wavelength conversion material layers 29 and 27 may have, but are not limited to, a trapezoidal cross-section. The transparent molding part 23 and the upper and lower wavelength conversion material layers 27 and 29 can be produced via molds using a molding technique such as transfer molding. Thus, the transparent molding part 23 and the upper and lower wavelength conversion material layers 29 and 27 can be formed in various shapes according to the shapes of the molds. In particular, the upper wavelength conversion material layer 29 may have a semi-spherical shape and an uneven surface in order to enhance light emission efficiency.

The phosphors contained in the upper and lower wavelength conversion material layers 29 and 27 are not limited to a particular kind of phosphor, and can include, for example, YAG-based phosphors, silicate-based phosphors, thiogallate-based phosphors, etc. In particular, the phosphors may be compounds containing lead or copper, such as silicate phosphors containing lead and copper, as is disclosed in Korean Patent Laid-open No. 10-2005-0117164.

Figure 2:
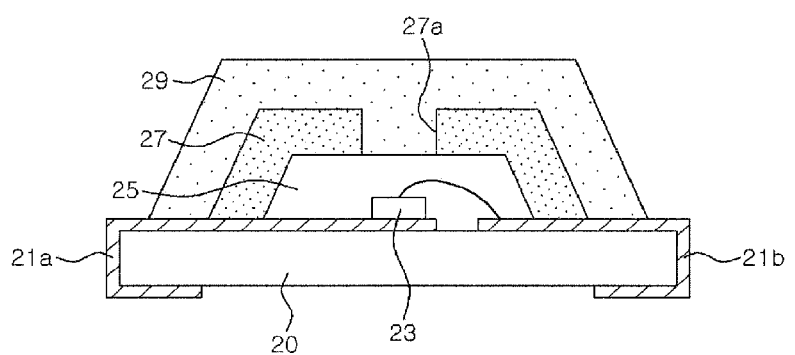
FIG. 2 is a cross-sectional view of a light emitting device including a plurality of wavelength conversion material layers according to a second embodiment of the present invention.

FIG. 2 is a cross-sectional view of a light emitting device including a plurality of wavelength conversion material layers according to a second embodiment of the present invention.

Referring to FIG. 2, the light emitting device according to this embodiment has the same general configuration as that of the light emitting device illustrated in FIG. 1, except that a lower wavelength conversion material layer 27 of the second embodiment includes an opening 27a. The opening 27a exposes a transparent molding part 25 and is filled with an upper wavelength conversion material layer 29.

Hence, a fraction of light emitted from a LED 23 enters the upper wavelength conversion material layer 29 in the opening 27a without passing through the lower wavelength conversion material layer 27. As a result, the quantity of light exciting a phosphor in the upper wavelength conversion material layer 29 can be increased.

The lower wavelength conversion material layer 27 may have a plurality of openings 27a, and the plural openings 27a may be dispersed therein to uniformly excite the phosphor in the upper wavelength conversion material layer 29.

Figure 3:
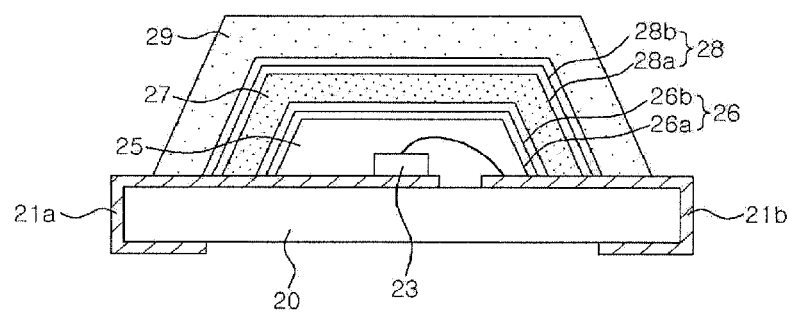
FIG. 3 is a cross-sectional view of a light emitting device including a plurality of wavelength conversion material layers according to a third embodiment of the present invention.

FIG. 3 is a cross-sectional view of a light emitting device including a plurality of wavelength conversion material layers according to a third embodiment of the invention.

Referring to FIG. 3, the light emitting device of the this embodiment includes an LED 23 mounted on a substrate 20, a transparent molding part 25 disposed to enclose the LED 23, and lower and upper wavelength conversion material layers 27 and 29 on the transparent molding part 25. Herein, a lower dielectric multilayer reflection mirror 26 is formed between the transparent molding part 25 and the lower wavelength conversion material layers 27, and an upper dielectric multilayer reflection mirror 28 is formed between the lower wavelength conversion material layers 27 and the upper wavelength conversion material layer 29.

The lower dielectric multilayer reflection minor 26 includes at least one pair of low- and high-refractivity dielectric layers 26a and 26b. Herein, the lower wavelength conversion material layer 27 has a lower refractive index than the high-refractivity dielectric layer 26b. The reflection mirror 26 includes the at least one pair of low- and high-refractivity dielectric layers 26a and 26b, each of which has a thickness satisfying the relationship: $(2m-1)\lambda_2/4n_2$ (where $n_2$ indicates a refractive index of each of the dielectric layers, $\lambda_2$ indicates a second wavelength, and m indicates an integer greater than or equal to 1) to reflect light of the second wavelength. Preferably, each of the dielectric layers has a thickness of $\lambda_2/4n_2$, that is, m is 1 in the relationship of $(2m-1)\lambda_2/4n_2$. As the number of pairs of the stacked dielectric layers 26a and 26b increases, the reflectance of the reflection mirror 26 with respect to the light of the second wavelength increases. Meanwhile, the reflection minor 26 exhibits light-transmitting characteristics with respect to light emitted from the LED 23.

Further, the upper dielectric multilayer reflection minor 28 includes at least one pair of low- and high-refractivity dielectric layers 28a and 28b. The upper wavelength conversion material layer 29 has a lower refractive index than the high-refractivity dielectric layer 28b. The reflection mirror 28 also includes the at least one pair of low- and high-refractivity dielectric layers 28a and 28b, each of which has a thickness satisfying the relationship of $(2k-1)\lambda_3/4n_3$ (where $n_3$ indicates a refractive index of each of the dielectric layers, $\lambda_3$ indicates a third wavelength, and k indicates an integer greater than or equal to 1) to reflect light of the third wavelength. Preferably, each of the dielectric layers has a thickness of $\lambda_3/4n_3$, that is, k is 1 in the relationship of $(2k-1)\lambda_3/4n_3$. As the number of pairs of the stacked dielectric layers 28a and 28b increases, the reflectance of the reflection minor 28 with respect to the light of the third wavelength increases. On the other hand, the reflection mirror 28 exhibits light-transmitting characteristics with respect to the light of the second wavelength and light emitted from the LED 23.

Accordingly, the light of the third wavelength produced via wavelength conversion in the upper wavelength conversion material layer 29 is prevented from entering the lower wavelength conversion material layer 27 by the upper dielectric multilayer reflection minor 28, and, the light of the second wavelength produced via wavelength conversion in the lower wavelength conversion material layer 27 is prevented from entering the transparent molding part 25 by the lower dielectric multilayer reflection minor 26.

In this embodiment, the lower wavelength conversion material layer 27 may also have an opening formed therein, as shown in FIG. 2, and the opening may be filled with the upper wavelength conversion material layer 29. At this point, the upper dielectric multilayer reflection minor 28 may extend into the opening to be interposed between the upper wavelength conversion material layer 29 and the transparent molding part 25 in the opening.

Figure 4:
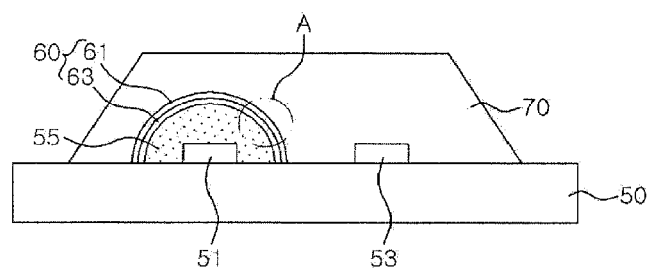
FIG. 4 is a cross-sectional view of a light emitting device including a dielectric multilayer reflection minor according to a fourth embodiment of the present invention.

FIG. 4 is a cross-sectional view of a light emitting device including a dielectric multilayer reflection minor according to a fourth embodiment of the present invention.

Referring to FIG. 4, the light emitting device includes a first LED 21 emitting light of a first wavelength and a blue LED 51 emitting blue light having a peak wavelength of, for example, 490 μm or less on a substrate 50. The substrate 50 is the same as the substrate 20 of the embodiment shown in FIG. 1. Further, the first LED 51 may be formed by growing GaAlInN-based compound semiconductor layers on a substrate formed of, for example, sapphire, SiC, spinel, or the like.

A wavelength conversion material 55 is formed to enclose the blue LED 51. The is wavelength conversion material 55 contains a phosphor capable of converting a fraction of blue light emitted from the blue LED 51 into light of other wavelengths, for example, green light or yellow light. The wavelength conversion material 55 can be formed by curing a transparent resin, such as silicone or an epoxy. The wavelength conversion material 55 may have a semi-spherical shape as shown in FIG. 4, but is not limited thereto, and be formed in a variety of shapes including a rectangular shape, a trapezoidal shape, etc.

A dielectric multilayer reflection minor 60 is formed on the wavelength conversion material 55. The reflection mirror 60 includes at least one pair of dielectric layers 61 and 63, in which the dielectric layer 61 has a higher refractive index and the dielectric layer 63 has a lower refractive index. The dielectric multilayer reflection mirror 60 may have a stacked structure prepared by stacking plural pairs 60a and 60b of high-refractivity dielectric layers 61a and 61b and low-refractivity dielectric layers 63a and 63b several times.

Further, the light emitting device includes a second LED 53, for example, a red LED 53, disposed on the substrate 50 and spaced apart from the wavelength conversion material 55. The LED 53 emits light of a second wavelength, which is longer than the first wavelength. The red LED 53 is formed of AlInGaP-based or GaAs-based compound semiconductors to emit light having a peak wavelength in the range of 580.about.680 nm, and can be disposed coplanar with the blue LED 51.

A sealing resin 70 may be disposed to enclose the red LED 53 and the wavelength conversion material 55. The sealing resin 70 can be formed by curing a resin such as silicone or epoxy, and formed by a mold cup in any shape capable of satisfying the requirements of improved viewing angle and light emission efficiency. The sealing resin 70 has a lower refractive index than the high-refractivity dielectric layer 61.

Red light emitted from the red LED 53 into the sealing resin 70 travels in various directions. Some red light is directed toward the wavelength conversion material 55 and reaches the reflection mirror 60. Since the reflection mirror 60 is formed to have a higher reflectance with respect to red light, the reflection mirror 60 reflects the red light. The reflection mirror 60 includes at least one pair of high- and low-refractivity dielectric layers 61 and 63, each of which has a thickness "d" satisfying the relationship: $d=(2m-1)\lambda/4n$ (where n indicates a refractive index of each of the dielectric layers, $\lambda$ indicates a wavelength of light emitted from the red LED, and m indicates an integer greater than or equal to 1) to reflect red light. Preferably, each of the dielectric layers has a thickness $d=\lambda/4n$, that is, m is 1 in the relationship of $(2m-1)\lambda/4n$. As the number of pairs of the stacked dielectric layers 61 and 63 increases, the reflectance of the minor with respect to red light increases. On the other hand, the reflection mirror 60 exhibits light-transmitting characteristics with respect to light emitted from the blue LED 51 or with respect to light produced via wavelength conversion by the phosphor in the wavelength conversion material 55.

Accordingly, red light emitted from the red LED 53 is prevented from entering the wavelength conversion material layer 55, whereby the red light can be prevented from being lost in the wavelength conversion material layer 55 and the blue LED 51.

Figure 6:
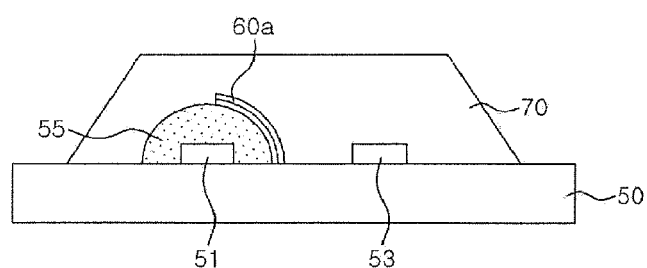
FIG. 6 is a cross-sectional view of a light emitting device including a dielectric multilayer reflection minor according to a fifth embodiment of the present invention.

FIG. 6 is a cross-sectional view of a light emitting device according to a fifth embodiment of the present invention.

Referring to FIG. 6, the light emitting device of this embodiment includes a blue LED 51 disposed on a substrate 50, a wavelength conversion material 55 enclosing the blue LED 51, and a red LED 53 separated from the wavelength conversion material 55 on the substrate 50, and may further include a sealing resin 70, as in the embodiment shown in FIG. 4.

Figure 5:
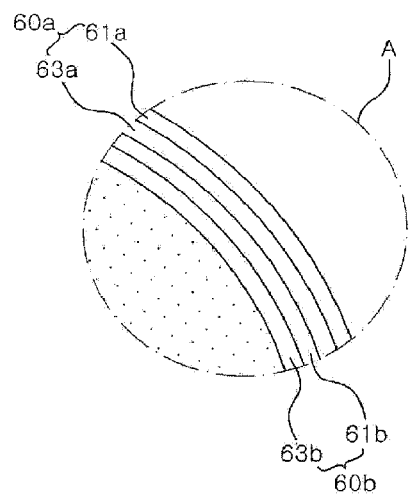
FIG. 5 is a partially enlarged cross-sectional view of part A of FIG. 4.

According to this embodiment, a reflection minor 60a also includes at least one pair of high- and low-refractivity dielectric layers, as in the embodiment shown in FIGS. 4 and 5. Unlike the reflection minor 60 shown in FIG. 4, however, the reflection mirror 60a is partially formed on the wavelength conversion material 55. In other words, the reflection minor 60a is formed on a limited region of the wavelength conversion material 55 to reflect light emitted from the red LED 53 and incident toward the wavelength conversion material 55, and thus, the other region of the wavelength conversion material 55 is exposed. With this configuration, it is possible to reduce light loss related to the reflection mirror 60a when light is emitted from the blue LED 51 into the sealing resin 70.

Figure 7:
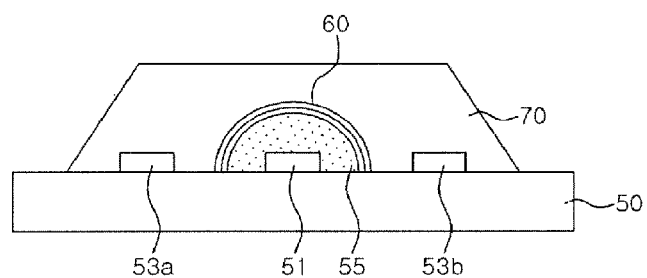
FIG. 7 is a cross-sectional view of a light emitting device including a dielectric multilayer reflection minor according to a sixth embodiment of the present invention.

FIG. 7 is a cross-sectional view of a light emitting device according to a sixth embodiment of the present invention.

Referring to FIG. 7, the light emitting device of this embodiment includes a blue LED 51 disposed on a substrate 50, a wavelength conversion material 55 enclosing the blue LED 51, and a reflection minor 60 on the wavelength conversion material 55, as in the embodiment shown in FIG. 4.

In this embodiment, however, red LEDs 53a and 53b are symmetrically disposed centered on the blue LED 51. The number of red LEDs 53a and 53b may be two or more. With this configuration, it is possible to provide uniform brightness distribution of red light emitted from the red LEDs 53a and 53b and uniform brightness distribution of mixed light.

In the meantime, as illustrated in FIG. 4, a sealing resin 70 may be formed to seal the red LEDs 53a and 53b and the wavelength conversion material 55.

Figure 8:
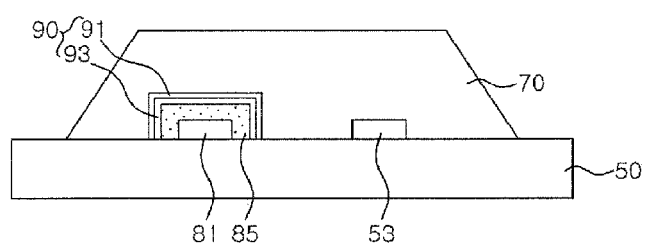
FIG. 8 is a cross-sectional view of a light emitting device including a dielectric multilayer reflection minor according to a seventh embodiment of the present invention.

FIG. 8 is a cross-sectional view of a light emitting device according to a seventh embodiment of the present invention.

Referring to FIG. 8, the light emitting device of this embodiment includes a blue LED 81 disposed on a substrate 50, a wavelength conversion material 85 enclosing the blue LED 81, and a reflection minor 90 on the wavelength conversion material 85, as in the embodiment shown in FIG. 4. Additionally, the light emitting device includes a red LED 53 separated from the wavelength conversion material 85 and a sealing resin 70 formed to seal the wavelength conversion material 85 and the red LED 53.

In this embodiment, the wavelength conversion material 85 is a material layer formed to uniformly enclose the blue LED 81. With the blue LED 81 disposed on the substrate, the wavelength conversion material 85 can be formed thereon by stenciling and the like. Alternatively, with the blue LED 81 attached onto a sub-mount (not shown), the wavelength conversion material 85 can be formed thereon by an electrophoresis process. A method of forming a phosphor layer having a uniform thickness based on the stenciling or electrophoresis process is disclosed in U.S. Pat. Nos. 6,642,652, and 6,650,044. The reflection minor 90 can be uniformly formed on the wavelength conversion material layer by stenciling and the like.

Alternatively, in a process of manufacturing blue LEDs 51, the wavelength conversion material layer 55 can be formed by growing compound semiconductor layers on a substrate, forming a plurality of blue LEDs through photolithography and etching, and then coating a transparent organic liquid or gel, for example, spin-on-glass (SOG), which contains a phosphor, over the substrate including the plurality of blue LEDs. After the formation of the wavelength conversion material layer over substrate, the plurality of blue LEDs are individually divided into the individual LEDs 51, each of which has the wavelength conversion material layer 55 of a uniform thickness. Herein, the reflection minor 60 can be formed on the wavelength conversion material layer 55 before the plurality of blue LEDs are divided into the individual LEDs 51, or can be formed thereon by a process, such as stenciling and the like, after the plurality of blue LEDs are divided into the individual LEDs 51.

According to this embodiment, since the wavelength conversion material layer 55 containing the phosphor has a uniform thickness, light from the blue LED 51 is emitted to the outside through a uniform optical path in the wavelength conversion material layer 55, so that light produced via wavelength conversion can exhibit uniform wavelength distribution.

In the embodiments described above, the blue LEDs 51 and 81 have been described as being enclosed by the wavelength conversion materials 55 and 88. However, the present invention is not limited to this configuration, and, a light emitting diode for emitting light of a first wavelength, for example, ultraviolet rays, can be employed instead of the blue LEDs. In this case, the wavelength conversion material contains a phosphor capable of converting ultraviolet rays into visible light, for example, blue light and/or yellow light.

In the embodiments, other light emitting diodes, such as a green LED, capable of emitting light of a second wavelength longer than the first wavelength can be employed instead of the red LEDs 53, 53a and 53b.

Meanwhile, in the embodiments, the LEDs 51, 81 and 83 are electrically connected to lead electrodes (not shown). For this purpose, sub-mounts (not shown) or bonding wires (not shown) can be used, and the LEDs can be attached to the lead electrodes via conductive adhesives. Although the LEDs 51, 81 and 83 can be electrically connected to an identical lead electrode and driven by an identical power source, the present invention is not limited to this configuration. Rather, the LEDs can be electrically respectively connected to separate lead electrodes and driven by different power sources.

As apparent from the above description, the present invention may provide a light is emitting device that includes a plurality of wavelength conversion material layers to realize mixed light, in which the wavelength conversion material layer containing a phosphor for performing wavelength conversion of light into relatively short wavelength light is disposed on another wavelength conversion material layer containing a phosphor for performing wavelength conversion of light into relatively long wavelength light, so that light produced via the wavelength conversion can be prevented from being lost by the phosphor. Further, a transparent molding part is disposed between the wavelength conversion material layers and a light emitting diode to prevent light produced via the wavelength conversion by the phosphors from being lost due to reentrance into the light emitting diode. Moreover, the present invention may provide a light emitting device that further includes a dielectric multilayer reflection minor to prevent light produced via wavelength conversion from being lost due to reentrance into the phosphor or the light emitting diode. In addition, the present invention may provide a light emitting device that further includes the dielectric multilayer reflection minor to prevent light, emitted from a second light emitting diode for emitting light of a longer wavelength, from being lost by the phosphor or a first light emitting diode for emitting light of a shorter wavelength due to reentrance into the wavelength conversion material.

Although the exemplary embodiments have been described with reference to the accompanying drawings, it should be noted that the present invention is not limited to the embodiments and the drawings, and that various modifications and changes can be made by those skilled in the art without departing from the spirit and scope of the present invention defined by the accompanying claims.

What is claimed is:

1. A light-emitting device, comprising;
a light-emitting diode arranged on a substrate, the light-emitting diode to emit light of a first wavelength;
a transparent molding part enclosing the light-emitting diode;
a first wavelength conversion material layer disposed on the transparent molding part and configured to convert the light of the first wavelength into light of a second wavelength, and comprising an opening;
a first light-transmitting member interposed between the light-emitting diode and the first wavelength conversion material layer; and
a second wavelength conversion material layer arranged on the first wavelength conversion material layer, the second wavelength conversion material layer to convert the light of the first wavelength into light of a third wavelength,
wherein the first light-transmitting member faces a surface of the light-emitting diode, and the first light-transmitting member is configured to transmit the light of the first wavelength and to reflect the light of the second wavelength, and
wherein the opening is filled with the second wavelength conversion material layer.

2. The light-emitting device of claim 1, further comprising:
a second light-transmitting member interposed between the first wavelength conversion material layer and the second wavelength conversion material layer.

3. The light-emitting device of claim 2, wherein the second light-transmitting member is spaced apart from the first light-transmitting member at a constant distance except at the opening in the first wavelength conversion material layer.

4. The light-emitting device of claim 1, wherein the second wavelength and the third wavelength are longer than the first wavelength.

5. The light-emitting device of claim 1, wherein the third wavelength is shorter than the second wavelength.

6. The light-emitting device of claim 1, wherein at least one of the first wavelength conversion material layer and the second wavelength conversion material layer comprises epoxy containing a phosphor.

7. The light-emitting device of claim 1, wherein the first light-transmitting member comprises a first surface and a second surface, the first surface facing an upper surface of the light-emitting diode and the second surface comprising a slope relative to a side surface of the light-emitting diode.

8. The light-emitting device of claim 7, wherein the first surface is connected to the second surface, and an end of the second surface contacts the substrate.

9. The light-emitting device of claim 7,
wherein the second light-transmitting member comprises a third surface and a fourth surface, the third surface facing the first surface and the fourth surface facing the second surface.

10. The light-emitting device of claim 9, wherein the third surface is connected to the fourth surface and an end of the fourth surface contacts the substrate.

11. The light-emitting device of claim 9, wherein an area of the third surface is wider than an area of the first surface.

12. The light-emitting device of claim 7, wherein the slope is formed to be at a predetermined angle to the side surface of the light-emitting diode.

13. The light-emitting device of claim 1, wherein the first wavelength conversion material layer and the first light-transmitting member comprise a trapezoidal cross-section.

14. The light-emitting device of claim 1, wherein the second wavelength conversion material layer comprises a trapezoidal cross-section.

15. The light-emitting device of claim 1, further comprising:
a first lead electrode and a second lead electrode disposed on the substrate and spaced apart from each other,
wherein the light-emitting diode is disposed on the first electrode.

16. The light-emitting device of claim 15, wherein at least parts of the first wavelength conversion material layer and the second wavelength conversion material layer directly contact the first lead electrode and the second lead electrode.

17. The light-emitting device of claim 16, wherein the first wavelength conversion material layer and the second wavelength conversion material layer each comprise a trapezoidal cross-section.

* * * * *